US010056147B1

(12) United States Patent
Alexopoulos et al.

(10) Patent No.: US 10,056,147 B1
(45) Date of Patent: Aug. 21, 2018

(54) TWO-LEVEL STORAGE DEVICE WITH FASTER FRONT END

(71) Applicant: Marvell International Ltd., Hamilton (BM)

(72) Inventors: Pantelis Alexopoulos, San Jose, CA (US); Dimitry Melts, San Jose, CA (US); Christophe Therene, Livermore, CA (US); Shinichiro Kuno, Hiratsuka (JP)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/604,303

(22) Filed: May 24, 2017

Related U.S. Application Data

(60) Provisional application No. 62/344,646, filed on Jun. 2, 2016, provisional application No. 62/400,330, filed on Sep. 27, 2016.

(51) Int. Cl.
*G11C 14/00* (2006.01)
*G06F 3/06* (2006.01)

(52) U.S. Cl.
CPC ........ *G11C 14/0009* (2013.01); *G06F 3/0613* (2013.01); *G06F 3/0659* (2013.01); *G06F 3/0685* (2013.01); *G11C 2207/2245* (2013.01); *G11C 2211/5643* (2013.01)

(58) Field of Classification Search
None
See application file for complete search history.

(56) References Cited

U.S. PATENT DOCUMENTS

| 9,128,847 | B2* | 9/2015 | Ito ........................ G06F 12/0868 |
| 2010/0115183 | A1 | 5/2010 | Araki et al. |
| 2011/0302365 | A1 | 12/2011 | Heo et al. |
| 2011/0320690 | A1 | 12/2011 | Petersen et al. |
| 2014/0164675 | A1* | 6/2014 | Ehrlich .............. G06F 12/0246 711/103 |
| 2014/0297909 | A1 | 10/2014 | Aiura et al. |
| 2015/0113214 | A1* | 4/2015 | Sutardja ............. G06F 12/0804 711/106 |
| 2015/0362965 | A1 | 12/2015 | Davis et al. |
| 2016/0335220 | A1 | 11/2016 | Breakstone et al. |
| 2017/0357609 | A1 | 12/2017 | Long et al. |

* cited by examiner

*Primary Examiner* — Harry W Byrne
*Assistant Examiner* — R Lance Reidlinger

(57) ABSTRACT

A data storage device includes a first data storage medium having a first capacity and a first speed, a second data storage medium having a second capacity and a second speed, and a device controller for interfacing between the data storage device and a host system. The second capacity is greater than the first capacity and the second speed is slower than the first speed. The device controller presents the data storage device to the host system as having a device capacity at least equal to the second capacity and a device speed at least equal to the first speed. The first data storage medium may be a solid-state drive while the second data storage medium is a hard disk drive. The device controller may be a solid-state drive controller, or a hard disk drive controller that may accept at least one solid-state drive command, such as a TRIM command.

10 Claims, 5 Drawing Sheets

TWO-LEVEL STORAGE DEVICE WITH FASTER FRONT END

CROSS REFERENCE TO RELATED APPLICATION

This claims the benefit of commonly-assigned U.S. Provisional Patent Applications Nos. 62/344,646 and 62/400,330, filed Jun. 2, 2016 and Sep. 27, 2016, respectively, each of which is hereby incorporated by reference herein in its respective entirety.

FIELD OF USE

This disclosure relates to a data storage device having two levels of storage. More particularly, this disclosure relates to a two-level storage device in which the front-end storage is faster than the back-end storage.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

There are various different types of data storage technologies used as mass storage for data processing devices and systems. The various types of storage technologies have different speeds and different costs per unit of data storage. The speed, and the cost per unit of data storage, tend to be directly related—i.e., the faster types of storage technologies also have higher costs per unit of data storage.

The various types of data storage technologies include tape, hard disk drives, and solid-state drives (i.e., collections of nonvolatile random access memory, such as Flash memory, that may be organized in a manner similar to a hard disk drive). Of these three types of storage, tape tends to be the slowest and least costly, while solid-state drives tend to be the fastest and most costly.

Because of its relatively low speed, and lack of random access, tape tends to be used only for archival purposes, if at all. However, both hard disk drives (HDDs) and solid-state drives (SSDs) remain in common use. Because of their relatively higher speed, SSDs are preferred for short access times, but HDDs are preferred for storing large amounts of data at relatively lower cost. Attempts have been made to provide hybrid drives, in which an HDD and an SSD are presented as a single device—e.g., the SSD may be used as a form of cache for the combined drive, storing most-recently-used data, particularly if those data are likely to be used again. However, either management of the two separate media had to be performed at the host system level, possibly by the central processing unit (CPU) of the host system, or the hybrid device was presented to the host system as an HDD, and therefore with the speed of an HDD, and the more limited feature set of an HDD. In addition, special vendor-specific drivers or protocols are sometimes required for such devices.

SUMMARY

A data storage device according to implementations of the subject matter of this disclosure includes a first data storage medium having a first capacity and a first speed, a second data storage medium having a second capacity and a second speed, the second capacity being greater than the first capacity and the second speed being slower than the first speed, and a device controller for interfacing between the data storage device and a host system. The device controller presents the data storage device to the host system as having a device capacity at least equal to the second capacity and a device speed at least equal to the first speed.

In one implementation of such a data storage device the first data storage medium is a solid-state drive and the second data storage medium is a hard disk drive.

In that implementation of such a data storage device, the device controller may be a solid-state drive controller. Alternatively, in that implementation of such a data storage device, the device controller may be a hard disk drive controller.

In that implementation of such a data storage device, the device controller may communicate with the host system according to a solid-state drive protocol. Alternatively, in that implementation of such a data storage device, the device controller may communicate with the host system according to a hard disk drive protocol. According to the latter alternative, the device controller may accepts at least one solid-state drive command. That command may be a solid-state drive TRIM command.

In another implementation of such a data storage device, the device controller comprises a final-level cache controller that apportions data between the first data storage medium and the second data storage medium according to frequency of access of the data.

In a variant of that implementation of such a data storage device, the first data storage medium is a first form of solid-state memory, and the second data storage medium is a second form of solid-state memory.

In another variant of that implementation of such a data storage device, the first data storage medium is Flash memory configured as a solid-state drive, and the second data storage medium is nonvolatile dynamic random access memory.

A method according to an implementation of the subject matter of this disclosure for operating a data storage device having a first data storage medium having a first capacity and a first speed, and a second data storage medium having a second capacity and a second speed, the second capacity being greater than the first capacity and the second speed being slower than the first speed, includes writing data from the host system initially to first data storage medium, checking frequency of access to data that has been written initially to the first data storage medium, and when the data that has been written initially to the first data storage medium is accessed more frequently than a first threshold criterion, maintaining the data in the first data storage medium and, when the data that has been written to the first data storage medium is accessed less frequently than the first threshold criterion, moving the data that has been written initially to the first data storage medium from the first data storage medium to the second data storage medium. The data storage device is thereby presented to the host system as having a device capacity at least equal to the second capacity and a device speed at least equal to the first speed.

A variant of that method implementation further includes checking frequency of access to data that has been written to the second data storage medium, and when data that has been moved to the second data storage medium has been accessed more frequently than a second threshold criterion, promoting the data that has been accessed more frequently than the second threshold criterion from the second data storage medium to the first data storage medium.

According to one alternative of that variant, the second threshold criterion is the same as the first threshold criterion. According to another alternative of that variant, the second threshold criterion is different from the first threshold criterion.

Where the first data storage medium is a solid-state drive and the second data storage medium is a hard disk drive, the method implementation further includes communicating with the host system according to a solid-state drive protocol.

Where the first data storage medium is a solid-state drive and the second data storage medium is a hard disk drive, the method implementation further includes communicating with the host system according to a hard disk drive protocol. That variant of the method may further include accepting at least one solid-state drive command. That command may be a solid-state drive TRIM command.

In another variant of that method implementation the writing, the maintaining and the moving are performed using a final-level cache.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
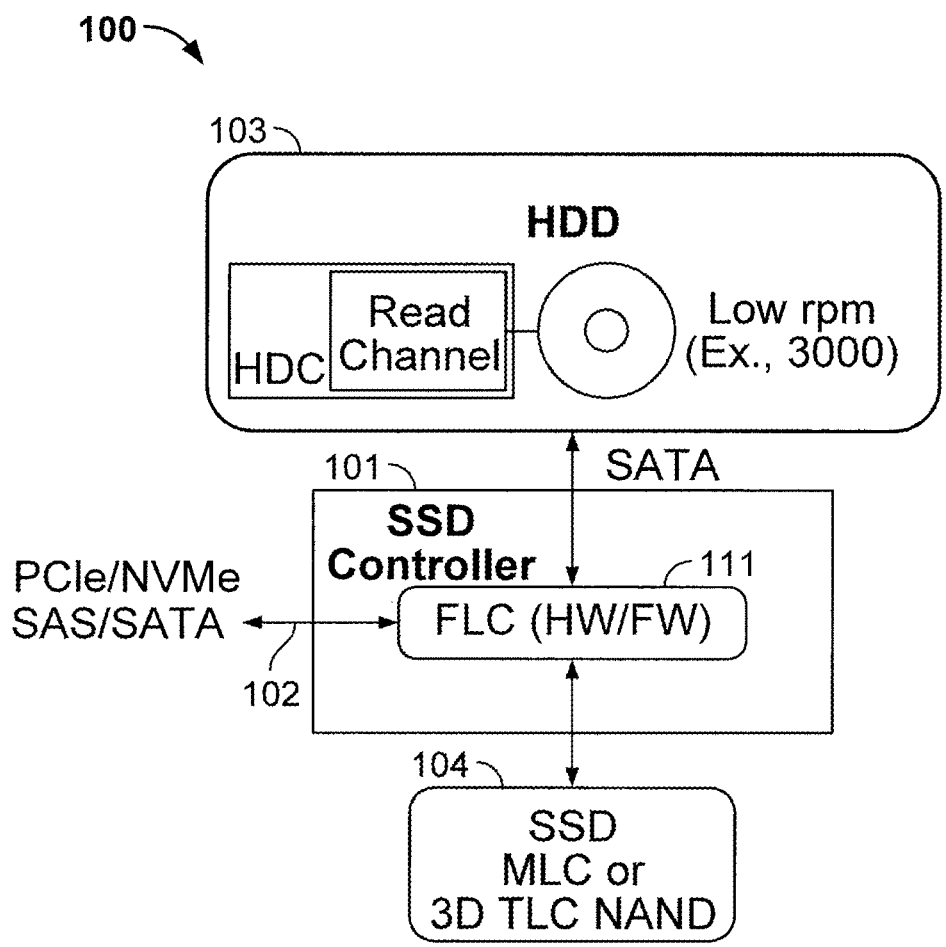
FIG. 1 is an overview of a storage device according to an implementation of the subject matter of this disclosure is shown.

In accordance with implementations of the subject matter of the present disclosure, a two-level storage device is provided where the first-level storage includes a relatively smaller, relatively faster type of storage than the second-level storage, while the second-level storage includes a relatively larger, relatively slower type of storage than the first level storage. The two-level storage device is presented to a host system as a device with the speed and features of the relatively smaller, relatively faster type of storage, but the capacity of the relatively larger, relatively slower type of storage.

In one example of an implementation of the subject matter of this disclosure, the first level of storage is Flash memory configured as an SSD, while the second level of storage is an HDD. Suitable hardware and firmware are provided to present such a hybrid drive to a host as a drive with the speed of the SSD but having capacity including the capacity of the HDD.

In another example of an implementation of the subject matter of this disclosure, the first level of storage memory is a form of nonvolatile dynamic random-access memory (DRAM) such as double-data rate (DDR) nonvolatile DRAM, while the second level of storage is a form solid-state memory that is slower than the first level of storage. The second level of solid-state memory could be Flash memory. Suitable hardware and firmware are provided to present such a hybrid drive to a host as a drive with the speed of the SSD and the capacity including the capacity of the second level of solid-state memory.

Additional implementations are possible. For example, in either of the aforementioned implementations, a "zeroth" level of memory, such as nonvolatile DRAM configured as a relatively large, fast cache (i.e., faster than the first-level SSD), can be provided.

In any case, the data storage device presented to the host system supports SSD commands such as the TRIM command, regardless of the host protocol (SATA/SAS/NVMe). However, standard host protocols may be used.

The aforementioned hardware and/or firmware may be a smart NAND controller, which may include a final-level cache (FLC), such as that described in commonly-assigned U.S. patent application Ser. No. 14/519,826, filed Oct. 21, 2014, which is incorporated herein by reference in its entirety, for "caching" most-recently used data at the storage device level in the faster first level of storage, although, unlike the case with ordinary cache, the first level of storage is nonvolatile and does not require flushing prior to shutdown, nor would data in the first level of storage be lost in the event of a power failure. Such an FLC may use Hashed Content Addressable Memory (HashCAM) to locate "cached" data.

The faster first level of storage also could be the initial destination for data newly written to the hybrid drive, to preserve the presentation of the drive to the host as having the speed of the faster first level of storage. Similarly, data to be read from the slower second level of storage could be transferred first to the faster first level of storage before being read out to the host. However, the time needed to transfer the data from one level of storage to the other level of storage may negate the speed advantage of the faster first level of storage in the read case, so in the read case, data to be read from the slower second level of storage could be read directly from the second-level storage. Nevertheless, if data can be identified that is accessed frequently, such data may be transferred from the slower second level of storage to the faster first level of storage. And if data responsive to a request from the host spans both the slower second level of storage and the faster first level of storage, it normally would be best to transfer each portion of the data directly from its respective level of storage to the host.

An overview of a storage device 100 according to an implementation of the subject matter of this disclosure is shown in FIG. 1. Controller 101 interfaces at 102 to a host system (not shown). Controller 101 includes an FLC 111 as described above. A relatively larger, relatively slower storage device 103 and a relatively smaller, relatively faster storage device 104 are controlled by controller 101. Interface 102 may support either or both of the SAS/SATA protocols more typically used with HDDs and the PCIe/NVMe protocols more typically used with SSDs. Relatively smaller, relatively faster storage device 104 may be thought of as a large, fast cache except that, unlike known cache, storage device 104 is not volatile, and therefore data in storage device 104 is not lost in case of a power or other failure, not is extensive flushing of the data in storage device 104 required at system shutdown. As described above, controller 101 may keep, in relatively smaller, relatively faster storage device 104, data that is most recently used, and possibly also data that is more likely (e.g., because of its type) to be used frequently.

Although, as discussed above, relatively larger, relatively slower storage device 103 and a relatively smaller, relatively faster storage device 104 could both be types of solid-state storage, more commonly (as shown) relatively larger, relatively slower storage device 103 will be an HDD, and relatively smaller, relatively faster storage device 104 will be an SSD. Two topologies are possible, as shown in FIGS. 2 and 3.

Figure 2:
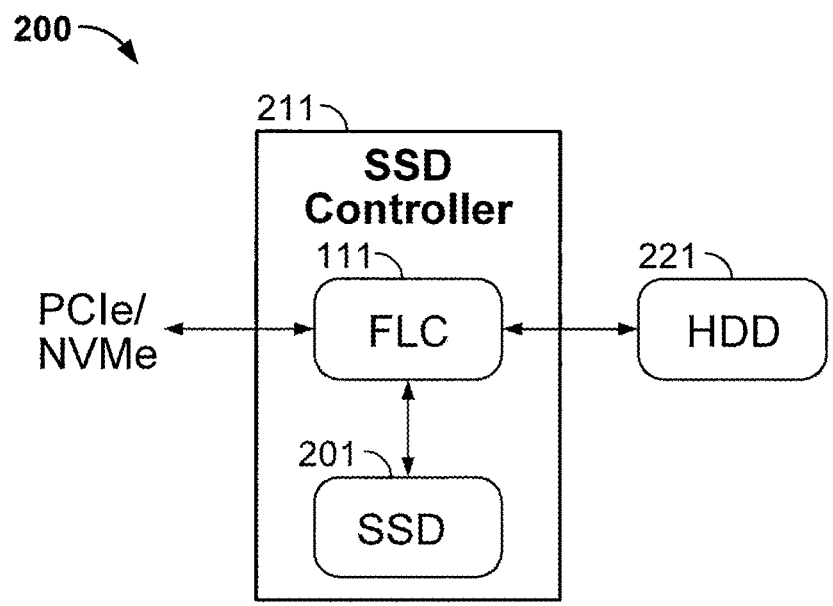
FIG. 2 shows a first variant of the storage device of FIG. 1.
Figure 3:
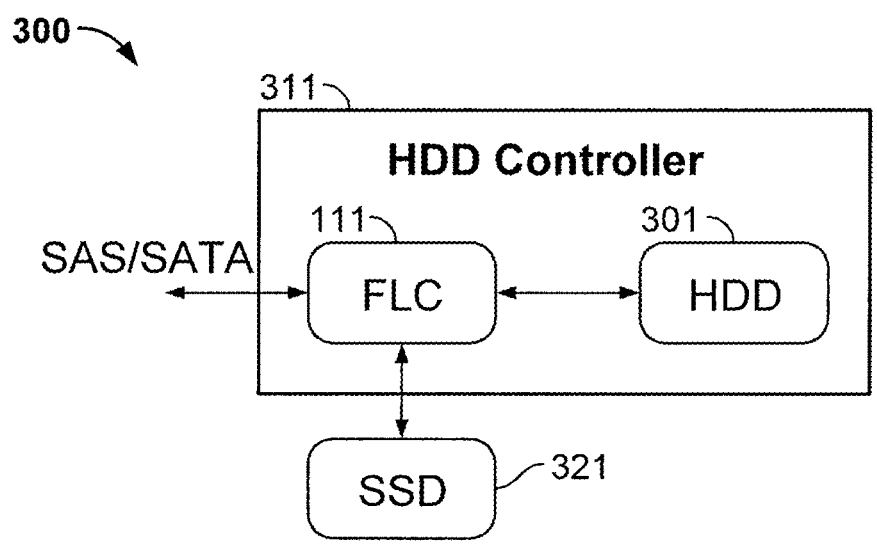
FIG. 3 shows a second variant of the storage device of FIG. 1.

As seen in FIG. 2, storage device 200 may be based on an SSD 201, with SSD controller 211 serving as controller 101 and connected also to HDD 221. Alternatively, as seen in FIG. 3, storage device 300 may be based on an HDD 301, with HDD controller 311 serving as controller 101 and connected also to SSD 321. Both SSD controller 211 and HDD controller 311 includes FLC 111.

Figure 4:
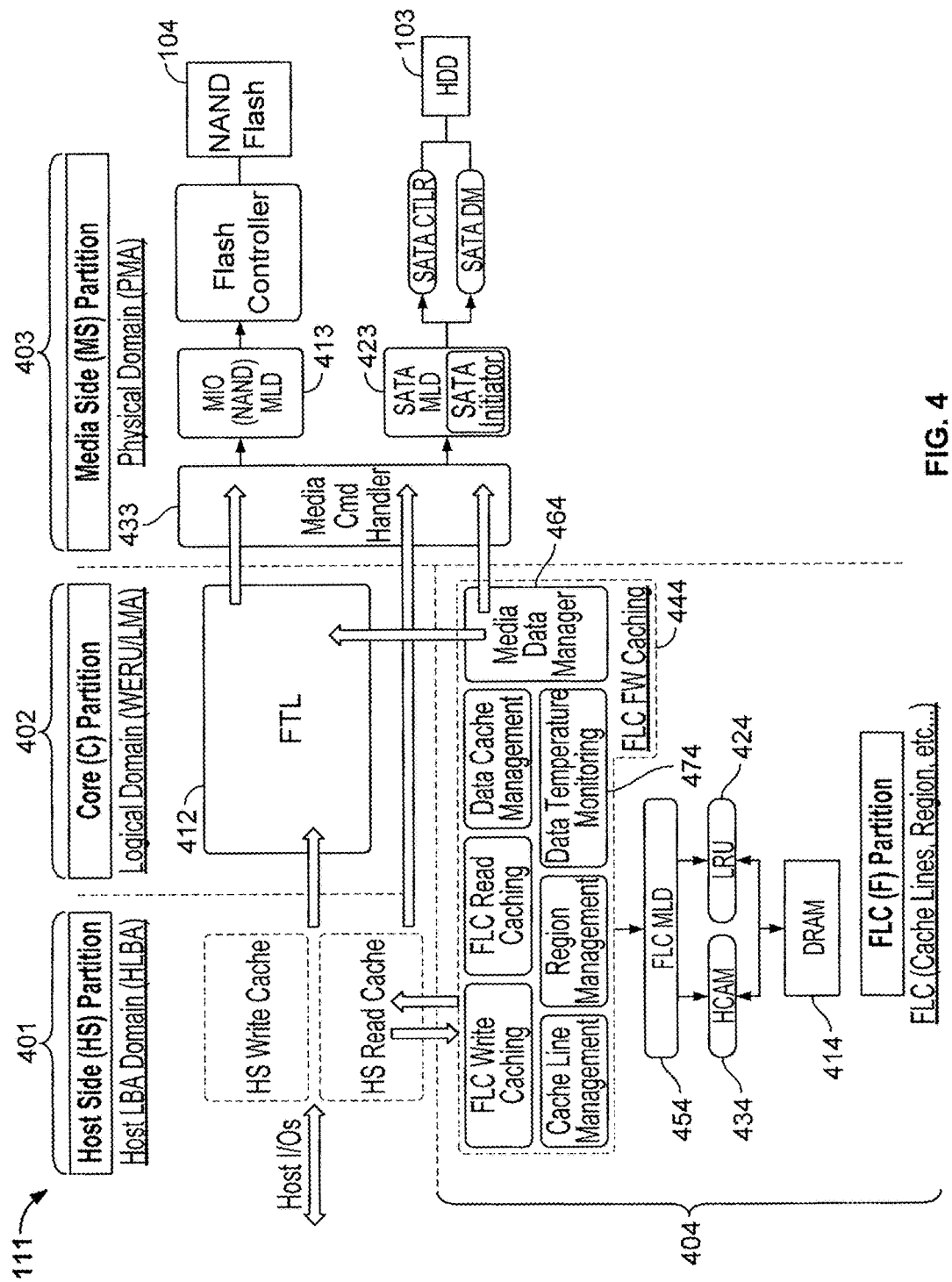
FIG. 4 shows the structure of an implementation of a final-level cache that may be used with a storage device according to the subject matter of this disclosure.

FLC 111 may have the structure shown in FIG. 4, including a host-side partition 401, a core partition 402, a media-side partition 403, and an FLC partition 404. Host-side partition 401 interfaces to the host device at 411 and may appear to the host, for example, as a large NVMe-compliant SSD, including TRIM support and a 4 kB sector size. Media-side partition 403 transfers data to and from the actual storage media of the two different storage devices. In the example shown, it is assumed that the larger, slower storage device is an HDD, and the smaller, faster storage device is an SSD. Therefore, media-side partition 403 includes a NAND Flash middle layer driver (MLD) 413 for controlling data transfers to and from NAND Flash memory 104, and SATA MLD 423 for controlling data transfers to and from HDD 103. Media command handler 433 accepts commands from core partition 402 and relays those commands to NAND Flash MLD 413 and SATA MLD 423. Core partition 402 includes primarily Flash translation layer (FTL) 412 which handles logical-to-physical mapping and, once FTL 412 determines where particular data is to be stored, FTL 412 passes instructions to media command handler 433.

FLC partition 404 includes cache-line memory 414 used by FLC 111 to maintain the data association between the smaller, faster storage device and the larger, slower storage device, Least-Recently Used (LRU) hardware or firmware 424 for determining when to evict data from cache-line memory 414, HashCAM hardware or firmware 434 for finding cached data, interacting via FLC MLD 454 with FLC cache control hardware or firmware 444, which in turn interacts with the host-side partition 401 to control where data is written to or read from. Cache control hardware or firmware 444 includes a media data manager 464 that interacts directly with media command handler 433 of media-side partition 403, and also with FTL 412, to which it may pass suggestions for data placement. Among other component of LC cache control hardware or firmware 444 is data temperature monitoring module 474, which helps determine which data is more or less recently used.

Figure 5:
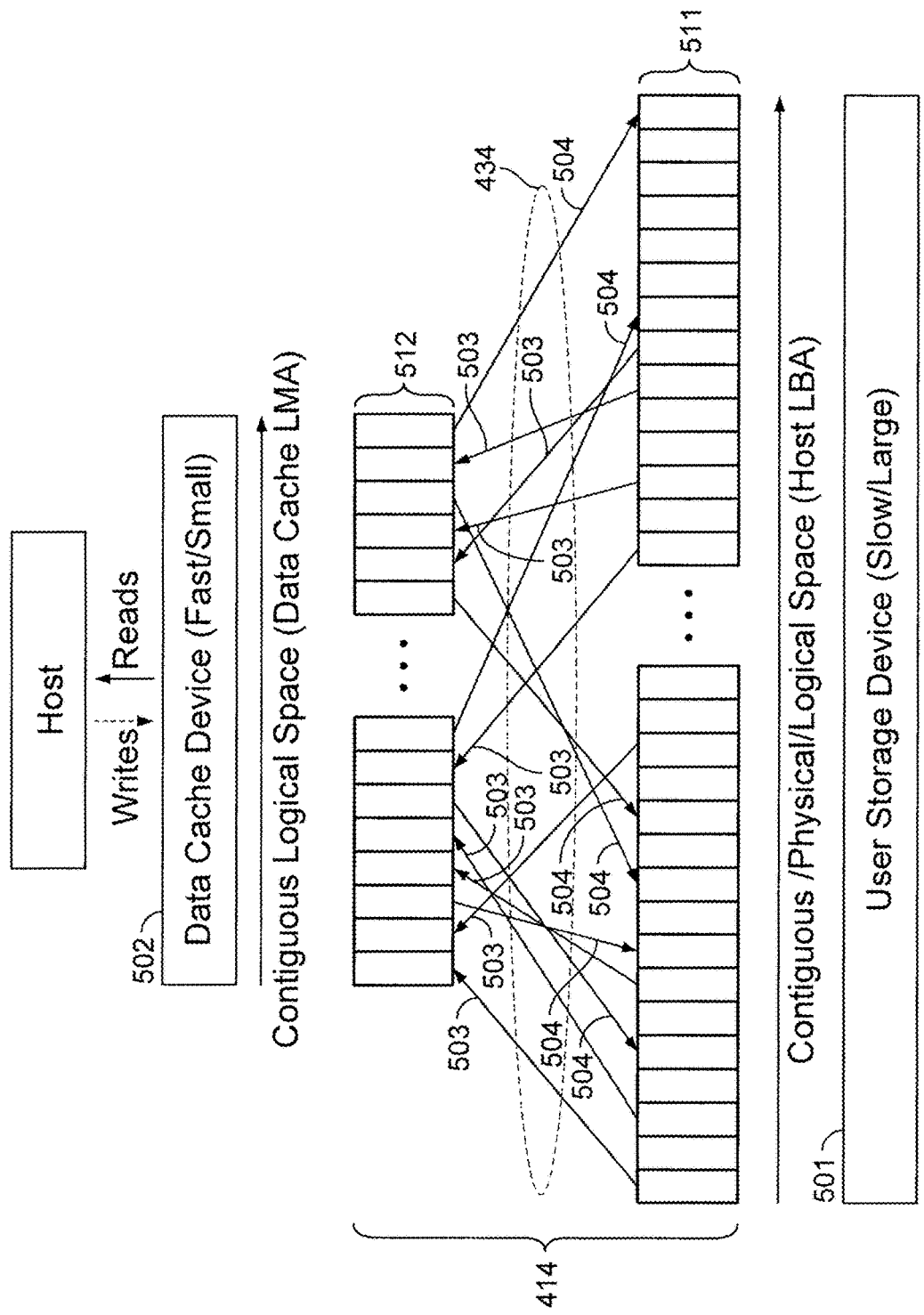
FIG. 5 shows a cache-line memory that may be used with the final-level cache of FIG. 4.

As noted above, and with reference to FIG. 5, FLC cache-line memory 414 is used to maintain the data association between the larger, slower storage 501 and the smaller, faster storage 502. Portion 511 of cache-line memory 414 represents mapped portions of larger, slower storage 501. Portion 512 of cache-line memory 414 represents mapped portions of smaller, faster storage 502. Arrows 503 show the mapping of data portions to be promoted from larger, slower storage 501 to smaller, faster storage 502, while arrows 504 show data portions to be written down from smaller, faster storage 502 to larger, slower storage 501.

According to one implementation of a method of operation, data is initially written into storage device 104 to preserve the appearance of device 100 to the host system as a faster device. However, such data normally will be kept in storage device 104 only if it is accessed more frequently than a first threshold criterion; if the data is accessed less frequently than the first threshold criterion, the data will be moved to slower device 103. Similarly, data that is stored in slower device 103 may be promoted to faster device 104 if that data is accessed more frequently than a second threshold criterion. The second threshold criterion may be the same as, or different from, the first threshold criterion. This may be implemented, for example, by LRU module 424 using known LRU techniques.

In some cases, it may be preferable to keep data in the slower device 103. For example, if the number of NAND devices in faster device 104 is relatively small, "slower" device 103 may be faster for some situations such as sequential accesses.

Figure 6:
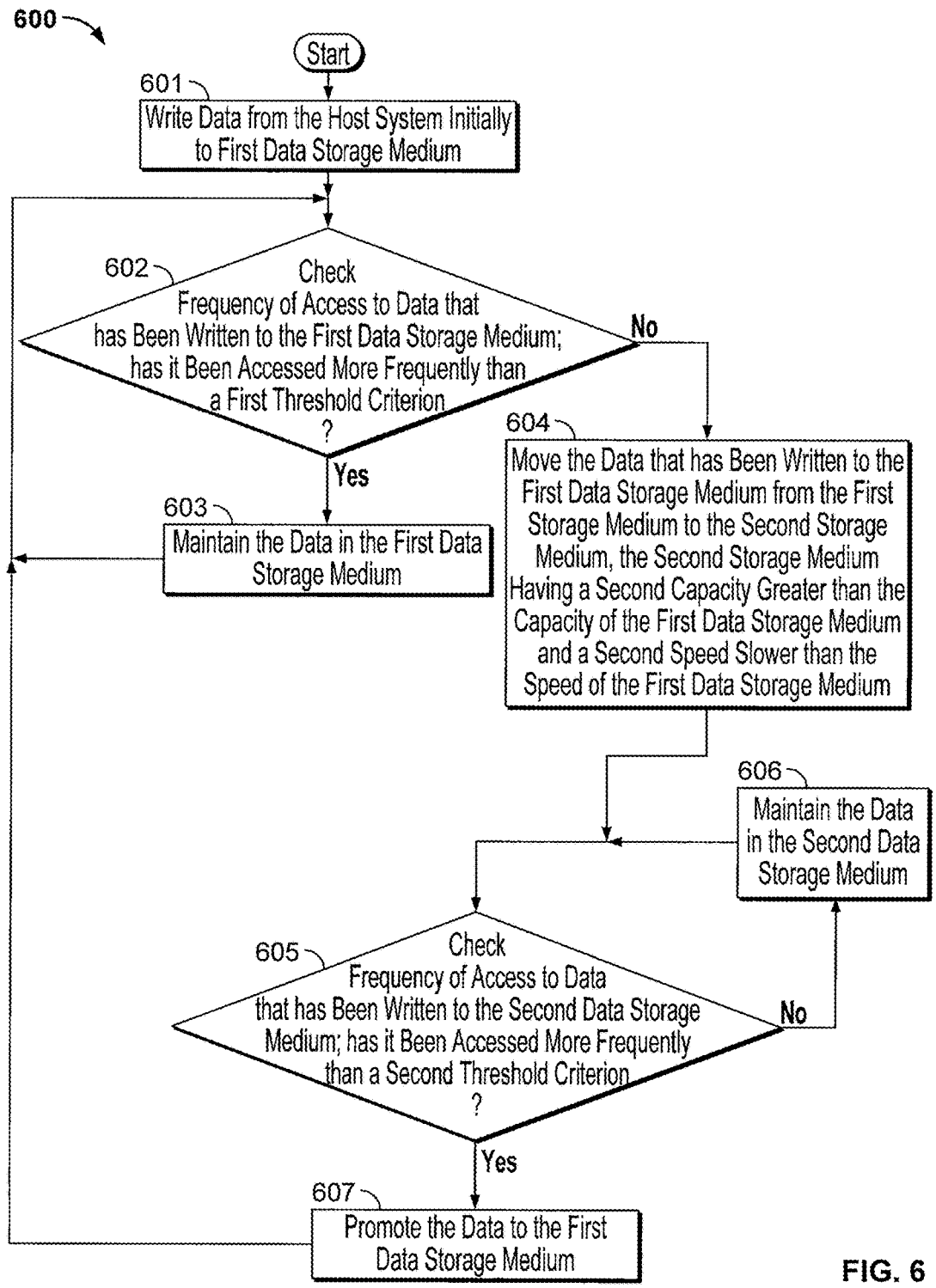
FIG. 6 shows a flow diagram of an example of a method of operating a storage device according to the subject matter of this disclosure.

One such implementation 600 of a method according to the subject matter of this disclosure is diagrammed in FIG. 6. At 601, data is written initially from a host system to the first data storage medium. At 602, the frequency of access to particular data that has been written to the first data storage medium is checked and compared to a first threshold. If at 602 the frequency of access to that particular data that has been written to the first data storage medium exceeds the first threshold, then at 603 that particular data is maintained in the first data storage medium. However, if at 602 the frequency of access to that particular data that has been written to the first data storage medium does not exceed the first threshold, then at 604 that particular data is moved to the second, larger, slower data storage medium.

At 605, the frequency of access to particular data that has been written to the second data storage medium is checked and compared to a second threshold, which may be the same as, or different from, the first threshold. If at 605 the frequency of access to that particular data that has been written to the second data storage medium does not exceed the second threshold, then at 606 that particular data is maintained in the second data storage medium. However, if at 605 the frequency of access to that particular data that has been written to the second data storage medium does exceed the second threshold, then at 607 that particular data is promoted to the first, smaller, faster data storage medium.

Thus it is seen that a data storage structure and method are provided having larger, slower storage and smaller, faster storage, which presents to host system with the size of the larger, slower storage and the speed of the smaller, faster storage.

As used herein and in the claims which follow, the construction "one of A and B" shall mean "A or B."

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:
1. A data storage device, comprising:
a first data storage medium having a first capacity and a first speed;

a second data storage medium having a second capacity and a second speed, the second capacity being greater than the first capacity and the second speed being slower than the first speed; and a device controller for interfacing between the data storage device and a host system, wherein:

the device controller comprises a final-level cache controller that apportions data between the first data storage medium and the second data storage medium based only on frequency of access of the data, and the device controller presents the data storage device to the host system as having a device capacity at least equal to the second capacity and a device speed at least equal to the first speed.

2. The data storage device of claim 1, wherein:
the first data storage medium is a solid-state drive; and
the second data storage medium is a hard disk drive.

3. The data storage device of claim 2 wherein the device controller is a solid-state drive controller.

4. The data storage device of claim 2 wherein the device controller is a hard disk drive controller.

5. The data storage device of claim 2 wherein the device controller communicates with the host system according to a solid-state drive protocol.

6. The data storage device of claim 2 wherein the device controller communicates with the host system according to a hard disk drive protocol.

7. The data storage device of claim 6 wherein the device controller accepts at least one solid-state drive command.

8. The data storage device of claim 6 wherein the device controller accepts a solid-state drive TRIM command.

9. The data storage device of claim 1, wherein:
the first data storage medium is a first form of solid-state memory; and
the second data storage medium is a second form of solid-state memory.

10. The data storage device of claim 9, wherein:
the first data storage medium is Flash memory configured as a solid-state drive; and
the second data storage medium is nonvolatile dynamic random access memory.

* * * * *